United States Patent
Ramkumar et al.

(10) Patent No.: US 7,799,670 B2
(45) Date of Patent: Sep. 21, 2010

(54) PLASMA OXIDATION OF A MEMORY LAYER TO FORM A BLOCKING LAYER IN NON-VOLATILE CHARGE TRAP MEMORY DEVICES

(75) Inventors: Krishnaswamy Ramkumar, San Jose, CA (US); Sagy Levy, Yaskov (IL); Jeong Byun, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 248 days.

(21) Appl. No.: 12/080,175

(22) Filed: Mar. 31, 2008

(65) Prior Publication Data

US 2009/0242962 A1   Oct. 1, 2009

(51) Int. Cl.
*H01L 21/4763* (2006.01)
(52) U.S. Cl. .............. 438/593; 438/216; 438/261; 438/591; 257/325
(58) Field of Classification Search ............ 438/216, 438/261, 591, 593; 257/325
See application file for complete search history.

(56) References Cited

U.S. PATENT DOCUMENTS 7,410,857 B2 * 8/2008 Higashi et al. ............ 438/216
2005/0224866 A1 * 10/2005 Higashi et al. ............ 257/324

* cited by examiner

*Primary Examiner*—Long K Tran

(57) ABSTRACT

A blocking layer of a non-volatile charge trap memory device is formed by oxidizing a portion of a charge trapping layer of the memory device. In one embodiment, the blocking layer is grown by a radical oxidation process at temperature below 500° C. In accordance with one implementation, the radical oxidation process involves flowing hydrogen ($H_2$) and oxygen ($O_2$) gas mixture into a process chamber and exposing the substrate to a plasma. In a preferred embodiment, a high density plasma (HDP) chamber is employed to oxidize a portion of the charge trapping layer. In further embodiments, a portion of a silicon-rich silicon oxynitride charge trapping layer is consumptively oxidized to form the blocking layer and provide an increased memory window relative to oxidation of a nitrogen-rich silicon oxynitride layer.

11 Claims, 7 Drawing Sheets

US 7,799,670 B2

PLASMA OXIDATION OF A MEMORY LAYER TO FORM A BLOCKING LAYER IN NON-VOLATILE CHARGE TRAP MEMORY DEVICES

TECHNICAL FIELD

The invention is in the field of semiconductor devices, more specifically pertaining to formation of a blocking layer in non-volatile charge trap memory devices.

BACKGROUND

Feature scaling in integrated circuits is an enabler of more capable electronic devices. Scaling to smaller features increases densities of functional units in a given form factor as well as increasing device processing speeds. Device scaling, however, is not without issue. For example, in non-volatile charge trap memory devices, both data retention and sensing becomes increasingly difficult as the devices are scaled. FIG. 1 illustrates a cross-sectional view of a conventional non-volatile charge trap memory device where an oxide-nitride-oxide (ONO) stack is used to store charge in a nitride layer having a high density of charge trap states, forming a semiconductor-oxide-nitride-oxide-semiconductor (SONOS) transistor. In functional terms, the first "Semiconductor" refers to the channel region of the substrate, the first "Oxide" refers to the tunneling layer, "Nitride" refers to the charge trapping layer, the second "Oxide" refers to the blocking layer and the second "Semiconductor" refers to the gate layer. The charge stored in the nitride trapping layer enables a SONOS transistor to provide non-volatility memory (NVM).

Referring to FIG. 1, non-volatile charge trap memory device 100 includes a SONOS gate stack 104 including a conventional ONO portion 106 formed over a silicon substrate 102. Non-volatile charge trap memory device 100 further includes source and drain regions 110 on either side of SONOS gate stack 104 to define a channel region 112. SONOS gate stack 104 includes a poly-silicon gate layer 108 formed above and in contact with ONO portion 106. Poly-silicon gate layer 108 is electrically isolated from silicon substrate 102 by ONO portion 106. ONO portion 106 typically includes an oxide tunneling layer 106A, a nitride or oxynitride charge trapping layer 106B, and an oxide blocking layer 106C overlying charge trapping layer 106B.

One limitation of conventional SONOS transistors is the poor quality of oxide employed as the blocking layer 106C which can reduce transistor performance (e.g. retention) through mechanisms such as carrier back streaming. The oxide of the blocking layer 106C is typically a deposited oxide, such as a high temperature oxide (HTO) formed with batch processing equipment. Generally, the HTO deposition process involves providing a silicon source, such as $SiH_4$, $SiH_2Cl_2$, or $SiCl_4$ and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C. While these deposition processes have been sufficient for relatively thick blocking layers, the wafer-to-wafer thickness non-uniformity, high film roughness and low film quality of such processes limit device performance as a SONOS transistor is scaled and the thickness of the blocking layer 106C is reduced.

BRIEF DESCRIPTION OF THE DRAWINGS

Embodiments of the present invention are illustrated by way of example, and not limitation, in the figures of the accompanying drawings in which.

DETAILED DESCRIPTION

Embodiments of a non-volatile charge trap memory device are described herein with reference to figures. In accordance with one embodiment of the present invention, the non-volatile trapped-charge memory device is a SONOS-type device wherein a charge trapping layer is an insulator layer, such as a silicon nitride or silicon oxynitride ($Si_xO_yN_2$). In another embodiment, the non-volatile trapped-charge memory device is a Flash-type device wherein the charge trapping layer is a conductor layer or a semiconductor layer, such as poly-silicon. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
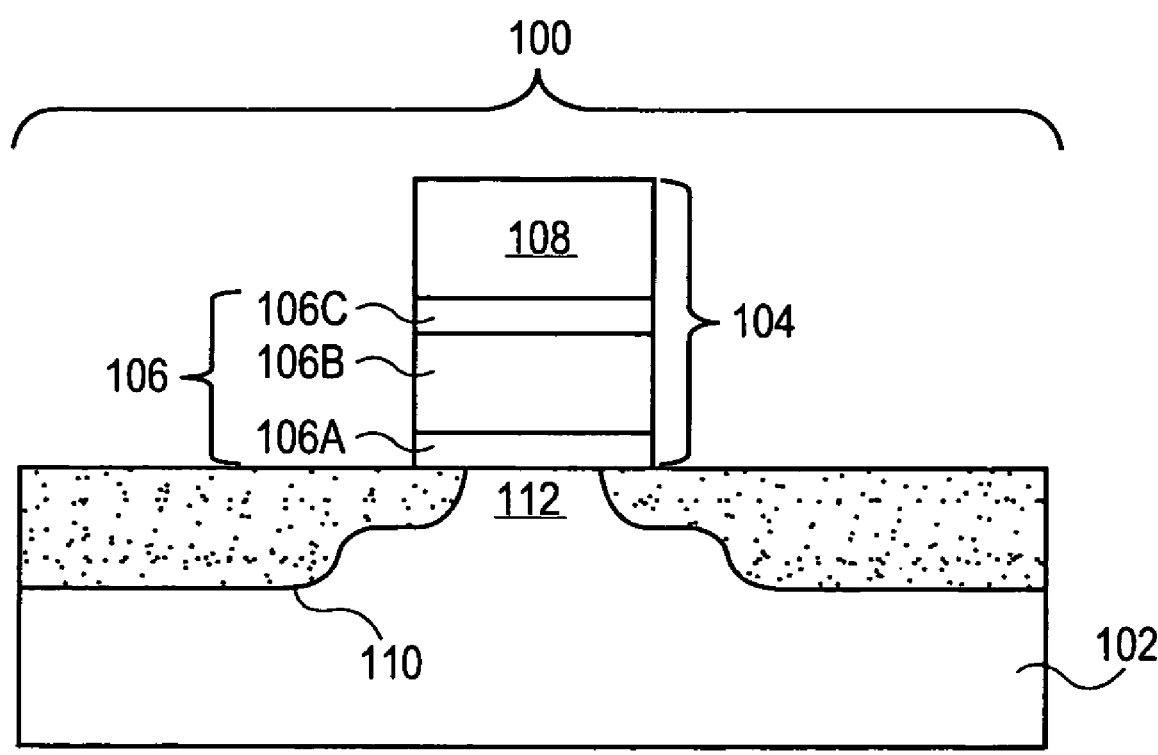
FIG. 1 illustrates a cross-sectional view of a conventional SONOS non-volatile charge trap memory device.
Figure 2:
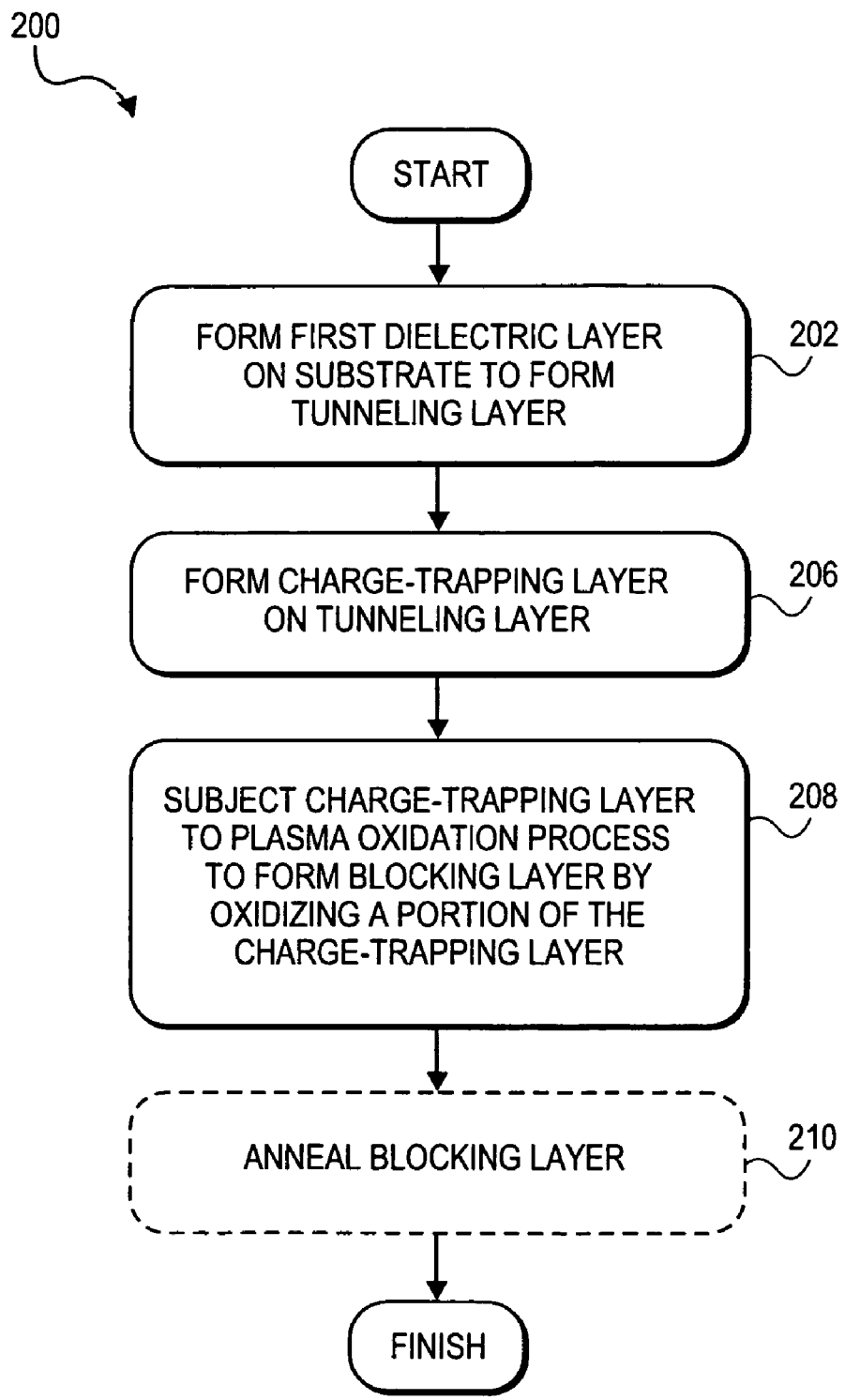
FIG. 2 illustrates a flow diagram depicting sequences of particular modules in the plasma oxidation of a charge trapping layer to form a blocking layer of a non-volatile charge trap memory device, in accordance with particular embodiments of the present invention.

FIG. 2 illustrates a flow diagram, generally depicting a series of modules employed in the fabrication method 200 of a non-volatile charge trap memory device, in accordance with particular embodiments of the present invention. Modules are to be understood as consisting one or more fabrication operations, each requiring one or more piece of semiconductor processing equipment. Thus, modules are a logical construct covering a number of physical embodiments. Method 200 begins at module 202 with formation of a first dielectric layer on a semiconductor substrate to provide a tunneling layer for a non-volatile charge trap memory device, such as a SONOS device. Subsequently, at module 206, a charge trapping layer is formed on the tunneling layer.

Next, at module 208, the charge trapping layer is subjected to a consumptive oxidation process to oxidize a portion of the charge trapping layer and thereby form a blocking layer of the non-volatile charge trap memory device. Finally, at module 210, an anneal of the charge trapping dielectric stack may then be performed, if desired, as denoted by the dotted line demarking module 210.

In the embodiments describe herein, formation of the blocking layer of the non-volatile charge trap memory device at module 208 is formed by consumptive oxidation, as opposed to a conventional dielectric deposition process, such as an HTO process. Generally, a blocking layer may be of a material and have a thickness selected to maintain a sufficient barrier to charge leakage while minimizing reductions gate electrode capacitance. In one embodiment, the composition of the blocking layer formed by oxide growth is substantially pure silicon dioxide. A grown oxide is typically of higher quality than a deposited oxide, such as HTO. For example, stress is typically lower in a grown oxide film and film density is typically higher because less hydrogen is incorporated, both of which may be advantageous in a layer serving as the blocking layer of a charge trap memory device. For example, stress may modulate the effective band gap of a material and therefore may directly impact the barrier potential of the blocking layer. The density of the grown silicon, reflecting the purity of the film, may also reduce trap assisted carrier back injection mechanisms.

In certain embodiments, the blocking layer is grown by a radical oxidation process. In accordance with one such embodiment, the radical oxidation process involves flowing hydrogen ($H_2$) and oxygen ($O_2$) gas into a process chamber and exposing the substrate to a plasma. The plasma oxidation process may thereby oxidize a portion of the charge trapping layer with a radical such as, but not limited to, an OH radical, an $HO_2$ radical and an O diradical. In one such embodiment, the $H_2$ volume percent is approximately zero percent (0%) to ninety percent (90%). In further embodiments, a carrier gas, such as helium (He) is also provided in the gas mixture. In one specific implementation, the oxidizing plasma process employs a high density plasma (HDP) source to provide a high rate of radical formation while maintaining low wafer bias voltages. An HDP chamber is commercially available from Applied Materials, Inc. of CA, USA or Novellus Systems of CA, USA. For such embodiments, the HDP chamber may be run with the gas mixtures described above at a process pressure of between 1 mT and 50 mT. The gas mixture may be energized with the high density source delivering between about 2500 W and 10000 W power normalized to a 300 mm substrate. In other embodiments, the plasma is further energized with a bias power below approximately 1000 W, normalized to a 300 mm substrate, to provide a low bias voltage on the substrate. While the HDP embodiment is advantageous because the chamber is well characterized for oxide film depositions, such as for shallow trench isolation (STI) applications, and is also readily configurable to flow hydrogen ($H_2$) and oxygen ($O_2$) gas, other plasma oxidation tools known in the art may also be employed in other embodiments.

In some embodiments, a consumptive oxidation is performed at a low temperature, below approximately 500 degrees ° C. In a preferred embodiment employing a high density plasma (HDP) chamber, the substrate is maintained on a susceptor heated to between approximately 300° C. and approximately 400° C. This temperature range is substantially lower than conventional deposition or thermal oxidation processes which are frequently performed at greater than 800 degrees ° C. to improve oxide quality. The substrate temperature may be kept relatively low because of the reactive species generated during the plasma oxidation process. Low temperature processing may advantageously reduce the thermal budget required to for a charge trapping dielectric stack. More specifically, modification of dielectric layers in the stack and the interfaces therebetween from the as-deposited state may be limited until subsequently annealed as a combined stack, providing a means to limit negative impact of thermal processing on the trap density in the memory layer. Furthermore, for fabrication processes where an advanced logic MOS transistor is integrated with non-volatile charge trap memory device, degradation of the logic MOS from thermal processing associated with formation of the non-volatile charge trapping dielectric layer stack may be reduced.

Because the blocking layer is grown, rather than deposited, the blocking layer may have superior thickness uniformity. The improved uniformity and quality enable fabrication of a scaled non-volatile charge trap memory device with improved parametrics. Growth of the blocking layer by oxidation may provide significantly better uniformity within a substrate as well as improved substrate-to-substrate thickness uniformity relative to CVD methods, particularly those performed in a batch processing furnace. For example, one embodiment employing an HDP plasma oxidation process at module 208, the within substrate uniformity with a sigma less than 2%. This is substantially better uniformity than conventional HTO depositions, which typically yield a within substrate uniformity of at least 3.5%. In particular embodiments employing a single substrate processing chamber, such as an HDP plasma chamber, substrate-to-substrate thickness variation can be reduced because gas depletion across a load in a batch processing furnace is avoided.

Growth of the blocking layer by oxidation may also significantly reduce micro-roughness and reduce waviness of the blocking layer relative to a deposition process, such as HTO. In one exemplary plasma oxidation embodiment, a roughness measurement indicated an Ra of approximately 1.7 Å and an Rmax of approximately 18 Å, while an HTO deposition process provided an Ra of approximately 2.4 Å and an Rmax of approximately 27 Å. While both values indicate a smoother top surface of the plasma-oxidized blocking layer, of particular note is the reduction in Rmax which is a peak-to-valley type measurement that is more sensitive to spikes in the blocking layer thickness. A reduction in spikes is advantageous because if a spike present at the location of a charge trap memory device may be detrimental to device performance and matching. For example, there may be a Vt difference between a device having a blocking layer with a spike and another device with a blocking layer free of any spikes. In this manner, the grown oxide may yield a lower Vt variation across a plurality of charge trap memory devices.

Figure 3:
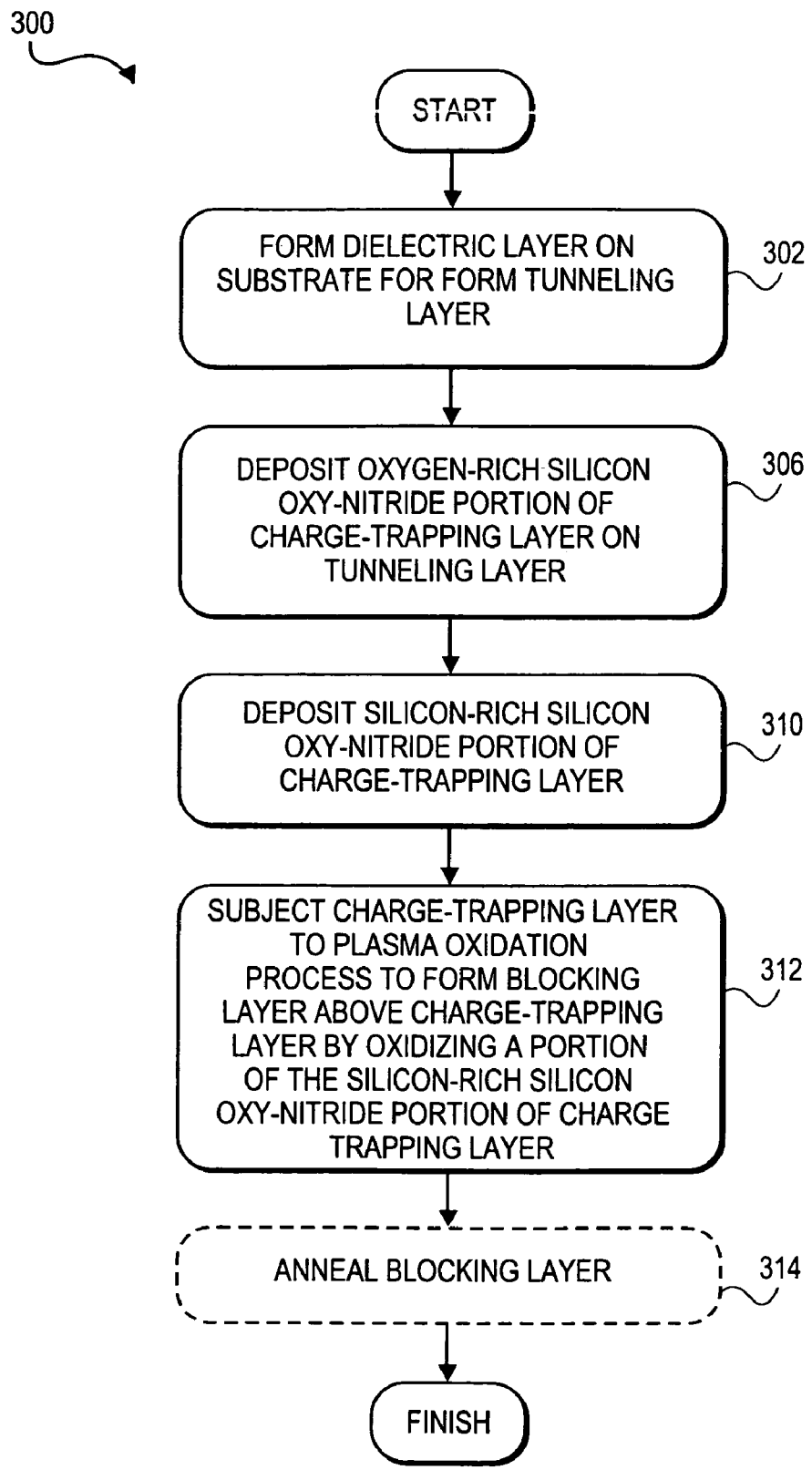
FIG. 3 illustrates a flow diagram depicting sequences of particular modules in the plasma oxidation of a silicon-rich silicon oxynitride layer in a multi-layered charge trapping layer to form a blocking layer of a non-volatile charge trap memory device, in accordance with particular embodiments of the present invention.

FIG. 3 illustrates a flow diagram depicting the fabrication method 300 of a non-volatile charge trap memory device, in accordance with particular embodiments including a silicon-rich silicon oxynitride layer as part of the charge trapping layer. Thus, FIG. 3 depicts a specific class of implementations of the method depicted in FIG. 2. In such embodiments, a portion of the silicon-rich silicon oxynitride layer is consumptively oxidized to form the blocking layer. Such embodiments have been found to provide increased memory windows relative to oxidation of an alternative charge trapping layer, such as a nitrogen-rich silicon oxynitride layer. Thus, as made clear from this embodiment, both the thickness and film composition of the charge trapping layer may be altered for the purpose of optimizing both the charge trapping capability of the charge trapping dielectric layer(s) and the blocking capability of a blocking dielectric to be subsequently grown from a portion of the charge trapping layer. Method 300 is now discussed in greater detail with reference to FIGS. 4A-4D.

Figure 4A:
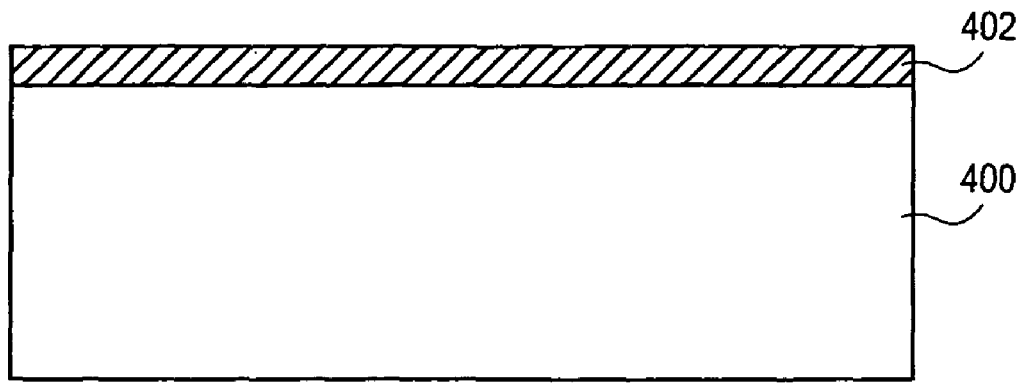
FIG. 4A illustrates a cross-sectional view representing operations in the formation of a semiconductor structure in which a tunneling layer is formed on a semiconductor substrate, in accordance with an embodiment of the present invention.

Method 300 begins at module 302 with formation of a first dielectric layer on a substrate to provide a tunneling layer for a non-volatile charge trap memory device, such as a SONOS device. Substrate 400, as depicted in FIG. 4A, may be composed of any material suitable for semiconductor device fabrication. In one embodiment, substrate 400 is a bulk substrate comprised of a single crystal of semiconductor material which may include, but is not limited to, silicon, germanium, silicon/germanium or a III-V compound semiconductor material. In another embodiment, substrate 400 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In still another embodiment, substrate 400 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxynitride. The lower bulk layer is comprised of a amorphous, polycrystalline or single crystal material which may include, but is not limited to, silicon, germanium, silicon/germanium, a III-V compound semiconductor material and quartz.

Tunneling layer 402 may be composed of a material and have a thickness suitable to allow charge carriers to tunnel into the charge trapping layer under an applied gate bias, while maintaining a suitable barrier to leakage when a non-volatile charge trap memory device is unbiased. In certain embodiments, tunneling layer 402 is a commonly known dielectric layer, such as silicon dioxide ($SiO_2$), a silicon oxynitride ($SiO_xN_y(H_z)$), a silicon dioxide that is subsequently nitridized, or a stack dielectric made of silicon dioxide and silicon nitride ($Si_3N_4$). It should be appreciated that because silicon is implicitly present in conventional silicon-based microelectronic fabrication processing, it is customary in the art to simply refer to "silicon oxynitride" as "oxynitride" and silicon nitride as "nitride," etc. In accordance with an embodiment of the present invention, tunneling layer 402 is formed by an oxidation process where the top surface of substrate 400 is consumed to form tunneling layer 402. For example, in one embodiment, substrate 400 is composed of silicon and tunneling layer 402 is composed of silicon dioxide. The tunneling layer may have a physical thickness of between about 1.5 nm and 3.0 nm. Tunneling layer 402 may be formed by any oxidation process convention in the art. For example, wet or dry oxidation process may be employed at a temperature approximately in the range of 950-1100° C.

Figure 4B:
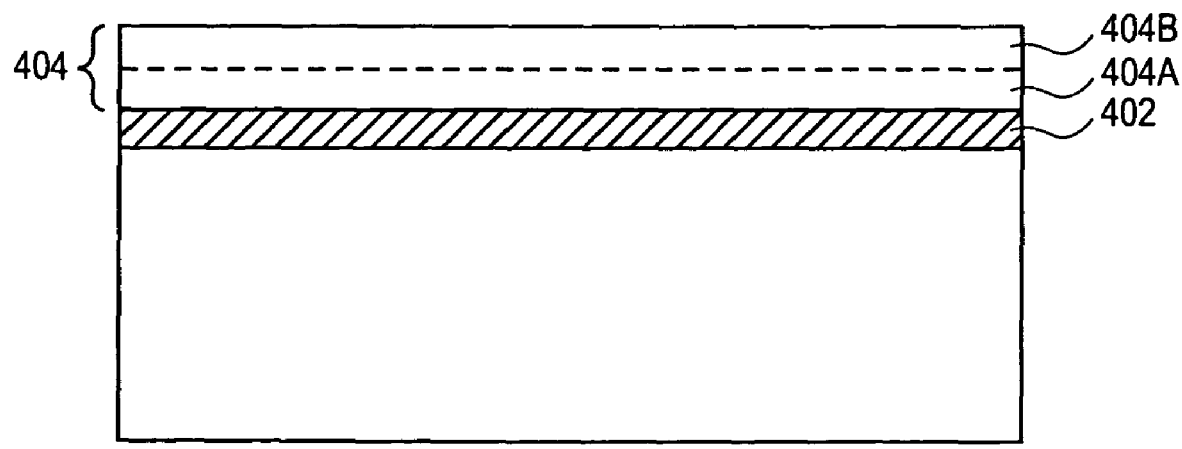
FIG. 4B illustrates a cross-sectional view representing operations in the formation of a semiconductor structure in which an oxygen-rich silicon oxynitride layer and a silicon-rich silicon oxynitride layer is formed on a tunneling layer, in accordance with an embodiment of the present invention.
Figure 4C:
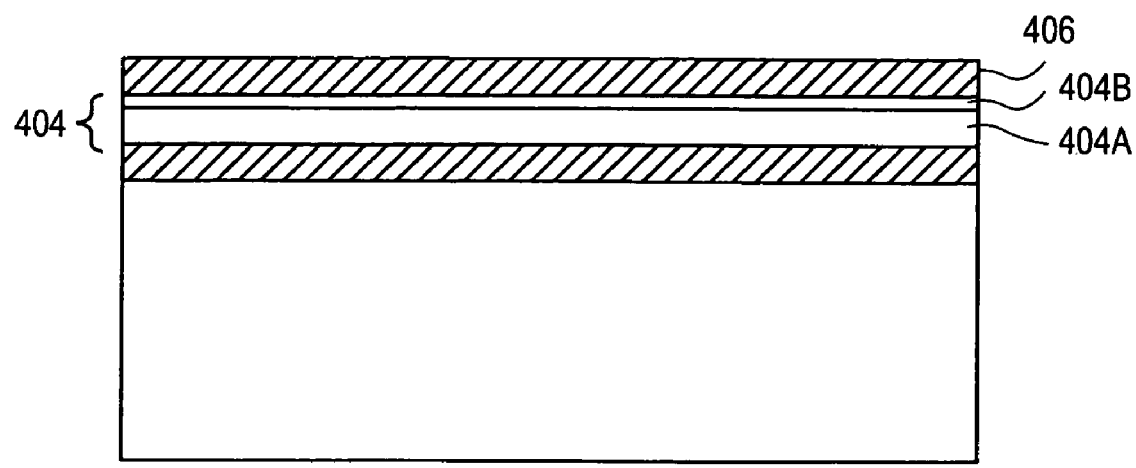
FIG. 4C illustrates a cross-sectional view representing operations in the formation of a semiconductor structure in which a silicon-rich silicon oxynitride layer is consumptively oxidized in a plasma oxidation process, in accordance with an embodiment of the present invention.
Figure 4D:
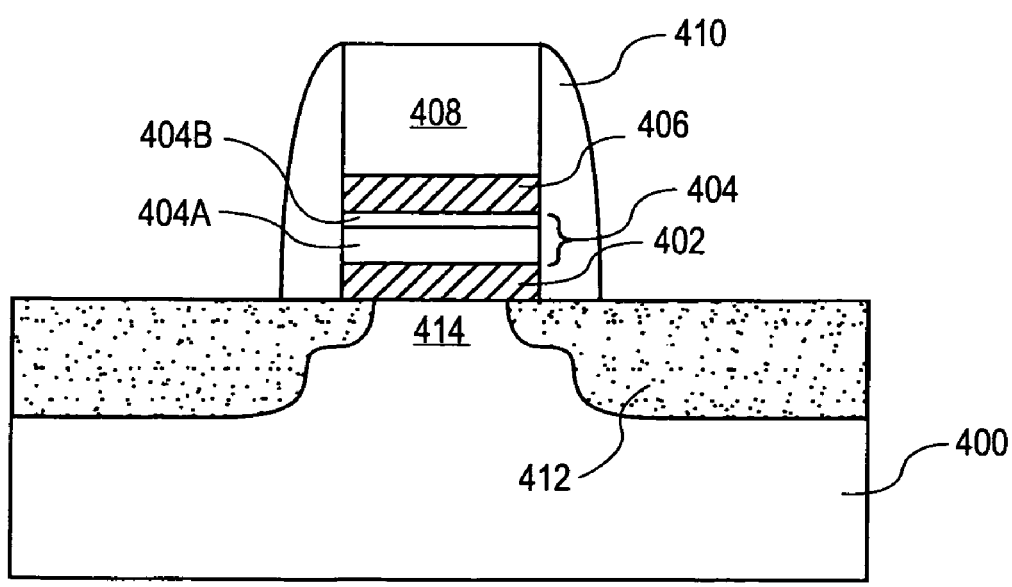
FIG. 4D illustrates a cross-sectional view of a non-volatile charge trap memory device incorporating a plasma a oxidized blocking layer, in accordance with an embodiment of the present invention.

FIG. 4B illustrates a cross-sectional view of a substrate having a charge trapping layer formed thereover, corresponding to module 306 of FIG. 3. The charge trapping layer 404 may be composed of a material(s) and have a thickness suitable to trap and store charge and thereby modulate a threshold voltage of the memory device. In accordance with an embodiment of the present invention, the charge trapping layer is composed of a material such as, but not limited to, silicon nitride, silicon oxynitride, oxygen-rich silicon oxynitride or silicon-rich silicon oxynitride.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt % of silicon and oxygen (i.e. reduction of nitrogen). An oxygen-rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt % of silicon with less oxygen than an "oxygen-rich" film. A silicon-rich silicon oxynitride film is therefore more like silicon and the RI is increased toward the 3.5 RI of pure silicon.

In another aspect of the present invention, the charge trapping layer 404 may include multiple composition regions across the thickness of the film. As depicted in FIG. 4B, the charge trapping layer 404 further includes a first dielectric layer 404A and a second dielectric layer 404B formed on the tunneling layer 402. While the charge trapping layer 404 is depicted and described further herein in the context of an advantageous multi-layered embodiment, other embodiments having only a single dielectric layer may be practiced by one of ordinary skill in the art.

In a specific embodiment, the first dielectric layer 404A comprises an oxygen-rich silicon oxynitride layer formed at module 306, while the second dielectric layer 404B comprises a silicon-rich silicon oxynitride layer formed at module 310. In such embodiments, the stoichiometry of the charge trapping layer 404 is modulated across the thickness to provide a high density of charge traps in the second dielectric layer 404B by incorporating a greater amount of silicon than the first dielectric layer 404A. The oxygen-rich stoichiometry of the first dielectric layer 404A, being more like silicon dioxide relative to silicon nitride, provides a good quality interface with tunneling layer 402. In one such embodiment, the composition of the oxygen-rich oxynitride results in the first dielectric layer 404A having a RI in the range of 1.7 and 1.9 and preferably about 1.8. In a further embodiment, the composition of the silicon-rich oxynitride results in the second dielectric layer 404B having an RI in the range of 1.8 and 2.0 and preferably about 1.9. It will be appreciated by one of ordinary skill in the art that such RI measurements become highly accurate with current assays only when a film has a thickness of at least 20 nm, which is substantially thicker than the film thickness employed in a charge trap memory device, such as a SONOS transistor. The RI, therefore, may be measured on a film deposited with the same method as that employed to for the charge trapping layer(s), but for a time sufficiently long to enable a thicker film and therefore a more accurate measurement. Nonetheless, it is to be understood that the RI values provided herein, while best measured on bulk films of at least 20 nm in thickness, are well correlated with the actual charge trapping layer composition.

In exemplary implementations, the first dielectric layer 404A of oxygen-rich silicon oxynitride, has a thickness between approximately 2.5 nm and approximately 3.5 nm while the second dielectric layer 404B, of silicon-rich silicon oxynitride, has a thickness between approximately 9 nm and approximately 10 nm. In certain implementations, a portion less than the entire as-deposited physical thickness of the second dielectric layer 404B is to be consumed by the subsequent oxidation process employed to form a blocking layer. For example, approximately 2-3 nm of the total thickness of the silicon-rich silicon oxynitride second dielectric layer 404B may be consumed in a subsequent process to form the blocking layer, in which case, the physical thickness of the charge trapping layer 404 is reduced to between approximately 9 nm and 13 nm. The portion of the charge trapping layer 404 targeted for subsequent consumption to form the blocking layer 406, may be composed entirely of silicon-rich silicon oxynitride. Because a portion (e.g. 2-3 nm) of the charge trapping layer 404 is to be consumed, the charge trapping layer 404 may be deposited to a thickness advantageously thicker (e.g. 10% to 30% thicker) than if a blocking layer was to be deposited (HTO). The ability to deposit a thicker charge trapping layer may be advantageous. For example, the process employed to form the charge trapping layer may be of a longer duration or performed at more controllable rate. Furthermore, the stoichiometric differential between the dielectric layers 404A and 404B may amplified or better controlled over a relatively thicker film, particularly if batch processes are employed for the formation of the charge trapping layer.

The dielectric layers 404A and 404B may be formed by a chemical vapor deposition process and may, or may not, be formed in the same process step or chamber. In an embodiment, the charge trapping layer 404 is formed on the tunneling layer 402 in a batch or single-wafer low-pressure chemical vapor deposition chamber. In one embodiment, dielectric layers 404A and 404B of the charge trapping layer 404 are formed at a temperature less than the temperature used to form the tunneling layer 402. In a specific embodiment, the dielectric layers 404A and 404B are formed at a temperature approximately in the range of 700-850° C. In such embodiments, the charge trapping layer 404 is formed by using gases such as, but not limited to, dichlorosilane ($H_2SiCl_2$), bis-(tert-butylamino)silane (BTBAS), ammonia ($NH_3$) or nitrous oxide ($N_2O$).

Where the charge trapping layer 404 is to include a non-uniform stoichiometry across the thickness, such as between dielectric layers 404A and 404B, the charge trapping layer 404 is formed by modifying the flow rate of ammonia ($NH_3$) gas and nitrous oxide ($N_2O$) as mixed with a silicon precursor, such as dichlorosilane ($SiH_2Cl_2$), to provide the desired gas ratios to form first an oxygen-rich oxynitride film for the first dielectric layer 404A and then a silicon-rich oxynitride film for the second dielectric layer 404B. Just as the terms "oxygen-rich" and "silicon-rich" are relative to a stoichiometric $Si_3N_4$ film, formation of these films may also be characterized based on the 3:1 volumetric flow rate ratio, $SiH_2Cl_2:NH_3$, commonly employed to produce a stoichiometric ($Si_3N_4$) with a CVD method. The oxygen-rich oxynitride film is therefore formed with a relatively higher volumetric flow rate of oxidizer (e.g. $N_2O$) than used for the silicon-rich oxynitride film while the both the oxygen-rich and silicon-rich oxynitride films are formed with a relatively higher volumetric flow rate of silicon precursor (e.g. $SiH_2Cl_2$).

In a specific batch embodiment, an oxygen-rich oxynitride film is formed by introducing a process gas mixture including $N_2O$, $NH_3$ and $SiH_2Cl_2$, while maintaining the chamber at a pressure approximately in the range of 5-500 mTorr, and maintaining substrate 400 at a temperature approximately in the range of 700-850° C., for a period approximately in the range of 2.5-20 minutes. In an exemplary embodiment, the process gas mixture includes $N_2O$ and $NH_3$ at a high volumetric flow rate ratio of about 1:1 to about 3:1 $N_2O:NH_3$ while the $SiH_2Cl_2$ to $NH_3$ is also at a high volumetric flow rate ratio from about 3.5:1 to 8:1 $SiH_2Cl_2:NH_3$. In a preferred embodiment, the $N_2O:NH_3$ ratio is about 2:1 while the $SiH_2Cl_2:NH_3$ is at a ratio of about 6:1. In certain embodiments, the gases are introduced at a flow rate approximately in the range of 5-200 standard cubic centimeters per minute (sccm).

In a further embodiment, a silicon-rich oxynitride film is then formed by introducing a process gas mixture including $N_2O$, $NH_3$ and $SiH_2Cl_2$, while maintaining the chamber at a pressure approximately in the range of 5-500 mTorr, and maintaining substrate 400 at a temperature approximately in the range of 700-850° C., for a period approximately in the range of 2.5-20 minutes in a batch furnace. The process gas mixture includes $N_2O$ and $NH_3$ at a volumetric flow rate ratio from about 1:8 to about 1:4 ($N_2O:NH_3$) with $SiH_2Cl_2$ and $NH_3$ at a volumetric flow rate ratio from about 3.5:1 to 5:1 ($SiH_2Cl_2:NH_3$). In a preferred embodiment, the $N_2O$ and $NH_3$ are provided at a volumetric flow rate ratio of about 1:5 ($N_2O:NH_3$) while the $SiH_2Cl_2$ and $NH_3$ are at a volumetric flow rate ratio of about 4:1 ($SiH_2Cl_2:NH_3$). In certain embodiments, the gases are introduced at a flow rate approximately in the range of 5 to 200 sccm.

Referring back to the embodiment depicted in FIG. 3, at module 312, a blocking layer of the of the non-volatile charge trap memory device is formed. In accordance with the embodiment depicted in FIG. 4C, the second dielectric layer 404B is subjected to an oxidation process to oxidize a portion of the charge trapping layer 404 and thereby grow the blocking layer 406 above the charge trapping layer 404. As depicted, the second dielectric layer 404B is made thinner by the oxidation process. In one embodiment, where the portion of the second dielectric layer 404B consumed to form blocking layer 406 is less than the as-deposited physical thickness of the second dielectric layer 404B, the portion of the second dielectric 404B remaining after oxidation (e.g. not consumed) remains functionally as a charge trapping layer.

In one embodiment, a silicon-rich silicon oxynitride second dielectric layer 404B is oxidized with a gas mixture including $H_2$ and $O_2$ at volumetric flow rate ratio of approximately 1:1 and a total flow of between 750 sccm and 1000 sccm mixed with a carrier gas, such as helium (He) in an HDP chamber operating at a process pressure of between 5 mT and 15 mT and energized into a plasma with between 2500 W and 3500 W of RF power normalized to a 300 mm substrate for between approximately 30 seconds to 60 seconds to form a silicon dioxide blocking layer 406 between 3.5 nm and 4.5 nm thick on the silicon-rich oxynitride layer. Thus, in an exemplary implementation where dielectric layer 404B is a silicon-rich silicon oxynitride region having a thickness approximately in the range of 9-10 nm, approximately 2-3 nm is consumed by the oxidation process to form the blocking layer 406 to a physical thickness in the range of approximately 3.5-4.5 nm. It has been found that a blocking layer grown by oxidation of a silicon-rich silicon oxynitride charge trapping layer is superior to a blocking layer grown by oxidation of a nitrogen-rich (silicon-lean) silicon oxynitride charge trapping layer. This phenomena is depicted in FIG. 5A and FIG. 5B.

Figure 5A:
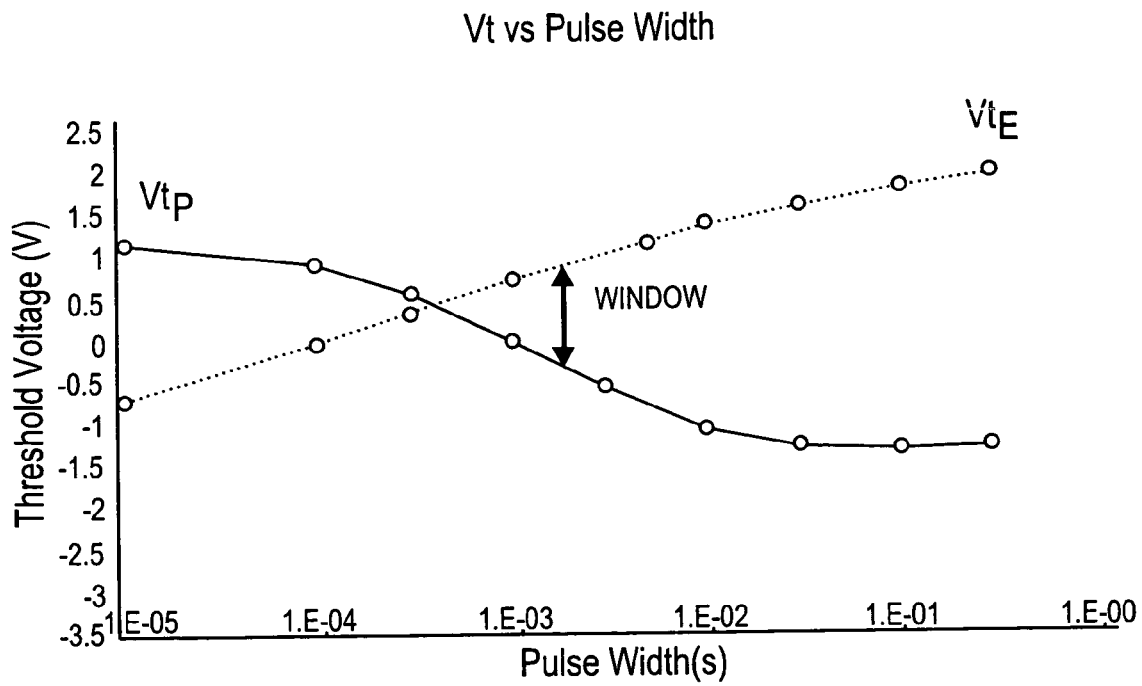
FIG. 5A, illustrates a graph depicting a memory window for a blocking layer grown from a nitrogen-rich silicon oxynitride layer.
Figure 5B:
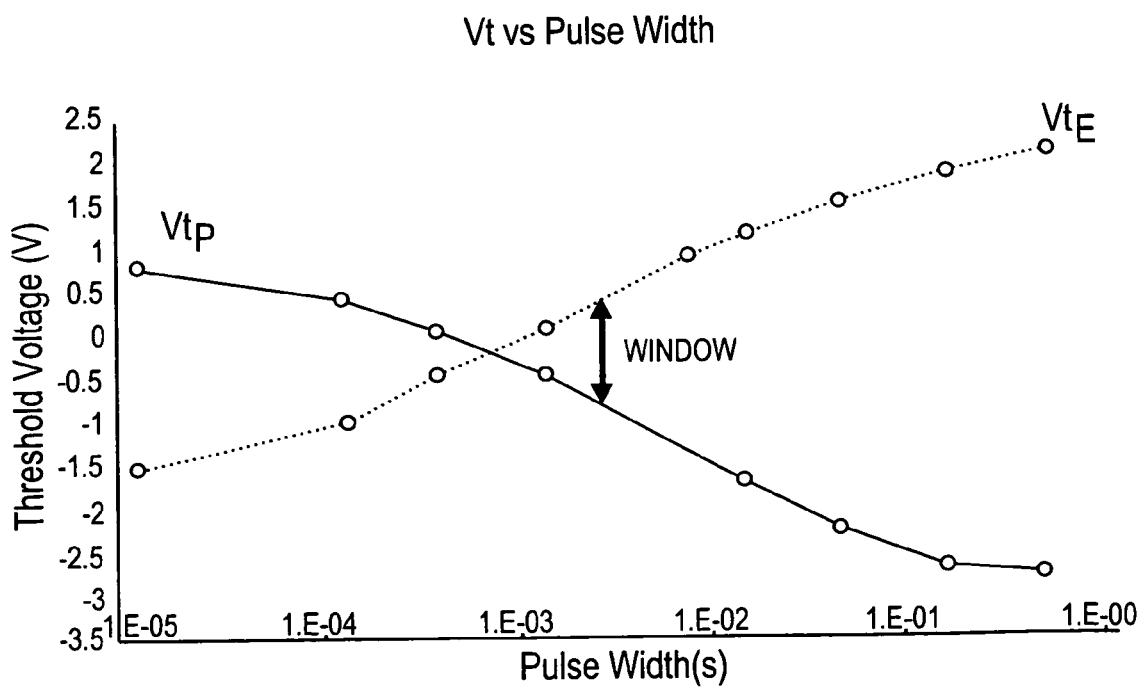
FIG. 5B, illustrates a graph depicting a memory window for a blocking layer grown from a silicon-rich silicon oxynitride layer.

FIGS. 5A and 5B are graphs of a programmed voltage threshold ($Vt_P$) and erased voltage threshold ($Vt_E$) of a SONOS transistor as a function of a program or erase voltage pulse. The difference between $Vt_P$ and $Vt_E$ is understood in the art to represent a "memory window" parametric. The memory window is an indication of the reliability of a SONOS devices because the beginning of life (BOL) window depicted will degrade over time until an end of life (EOL) window is determined after reliability testing to simulate 10 years at 85° C. Thus, both a large BOL window and a slow decay rate are advantageous.

FIG. 5A depicts a SONOS device with a nitrogen-rich silicon oxynitride charge trapping layer, from which a blocking layer is oxidized. FIG. 5B depicts a SONOS device with silicon-rich silicon oxynitride charge trapping layer, such as described for an embodiment of second dielectric 404B, from which a blocking layer is formed by oxidation. As depicted, the BOL window is significantly larger for the silicon-rich condition of FIG. 5B than for the nitrogen-rich condition of FIG. 5A. More specifically the BOL window for the silicon-rich oxidized blocking layer treatment was 2.6 V as compared to 2.2 V for the nitrogen-rich oxidized blocking layer treatment. The EOL window was 1.8 V for the silicon-rich oxidized blocking layer treatment and 0.85 V for the nitrogen-rich oxidized blocking layer treatment. The program and erase rates of the silicon-rich oxidized layer are approximately half those of the nitrogen-rich oxidized layer. While not being bound by theory, it is believed the superior window depicted in FIG. 5B is at least in part a result of the oxidized blocking layer providing a superior barrier to carrier back injection.

The oxidation consuming a portion of the charge trapping layer 404 modifies the composition of the remaining portion of charge trapping layer 404 from the as-deposited composition. This modification of the as-deposited composition is at least in part due to nitrogen migration into the dielectric layer 404B remaining after oxidation from the portion consumed by the oxidation to form blocking layer 406. Thus, nitrogen present in the portion of the charge trapping layer 404 remaining after oxidation will have a higher nitrogen concentration than as-deposited. This phenomena does not occur when blocking layer 406 is formed by a deposition method (e.g. HTO). In this manner, both the thickness and film composition of the charge trapping layer 404 may be altered for the purpose of optimizing both the charge trapping capability of the charge trapping dielectric layer(s) and the blocking capability of a blocking dielectric to be subsequently grown from a portion of the charge trapping layer.

Figure 6:
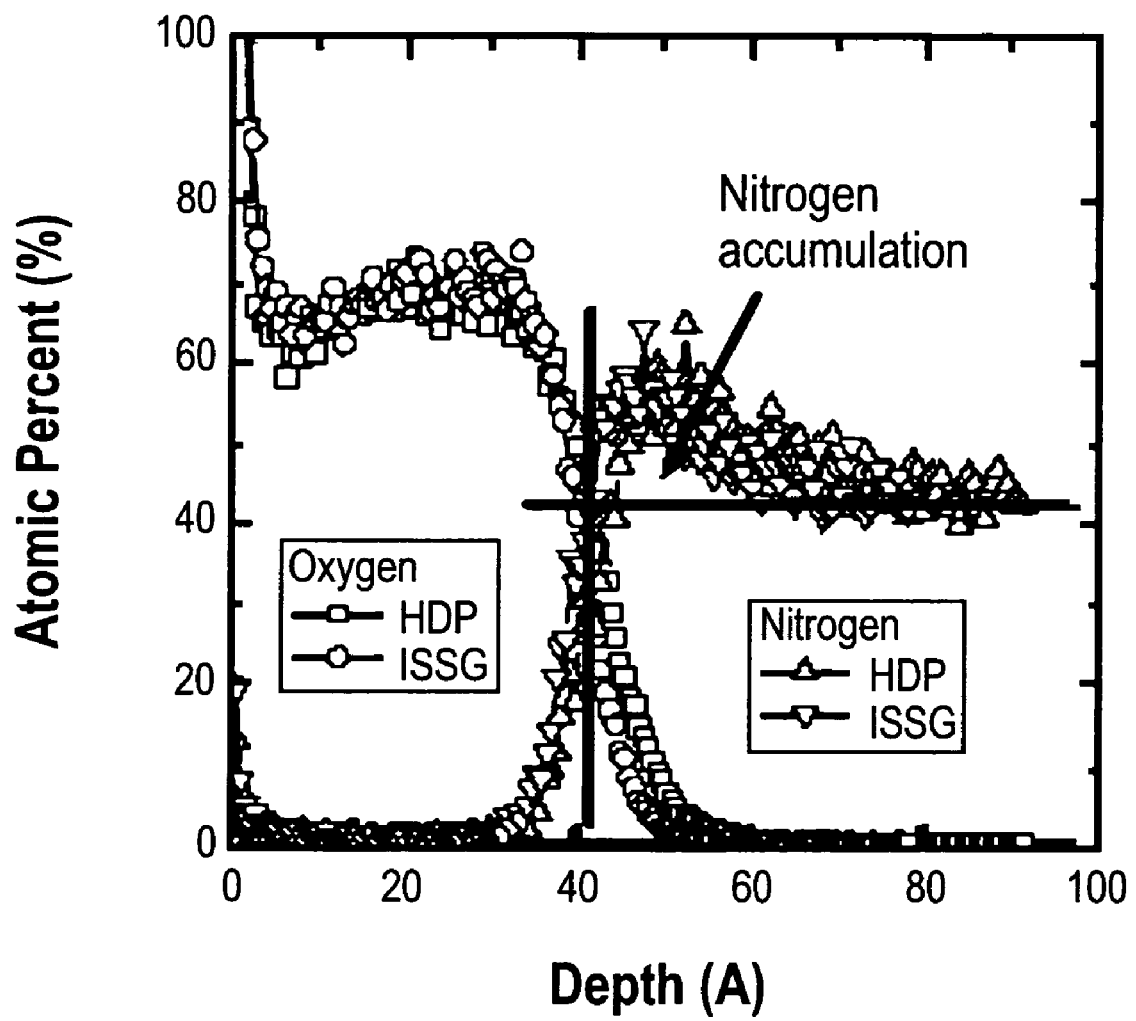
FIG. 6 illustrates a graph depicting a SIMS measurement of oxygen and nitrogen present in a blocking layer and a charge trapping layer.

The nitrogen pile up induced by consumptive oxidation is detectable with a secondary ion mass spectrometry (SIMS) measurement. FIG. 6 depicts exemplary SIMS profile indicating the concentrations in atoms/cm$^3$ of nitrogen (N), oxygen (O) after oxidative growth of a blocking layer from a silicon-rich silicon oxynitride layer, such as that described for embodiments of the second dielectric layer 404B. The x-axis of FIG. 6 represents the depth with 0 angstrom (Å) being at the exposed top surface of the blocking layer and proceeding into the test sample film representing a charge trapping silicon oxynitride layer. In the embodiment shown, the composition of a 4 nm thick blocking layer is essentially silicon dioxide with substantially no nitrogen present. As demarked by the arrow in FIG. 6, significant nitrogen accumulation is visible within about 2 nm of the charge trapping layer proximate to the blocking layer (from the depth of about 40 Å to 80 Å in the test sample) with the nitrogen concentration then tailing off with a distribution characteristic of diffusion processes. Because of this nitrogen migration, embodiments including a silicon-rich silicon oxynitride second dielectric layer 404B have a higher nitrogen concentration at the interface of the silicon dioxide blocking layer 406 than at the interface of an oxygen-rich silicon oxynitride first dielectric layer 404A.

While the nitrogen migration during the oxidation process of module 312 provides a good quality oxide for the blocking layer 406, nitrogen accumulation below the blocking layer, in the charge trapping layer 404 may be detrimental to device performance. Thus, embodiments employing a silicon-rich silicon oxynitride as the dielectric layer 404B, or more generally in the charge trapping layer 404, may provide a superior charge trapping ability than do embodiments where a nitrogen-rich layer is oxidized because the quantity of nitrogen which migrates into the charge trapping layer 404 for the silicon-rich embodiments is relatively lower than for oxynitride that is relatively nitrogen-rich (silicon-lean).

To conclude method 300 of FIG. 3, at module 314, an anneal of the charge trapping dielectric stack may be performed. The anneal, while optional to the oxidation methods disclosed herein, may be advantageous in embodiments employing particularly low temperature oxidation process. The anneal may be performed in an atmosphere including nitrogen at a temperature approximately in the range of 900-1100 degrees ° C. for a duration approximately in the range of 30 seconds to 60 seconds for a single substrate apparatus or approximately in the range of 5 minutes to 20 minutes in a batch processing apparatus. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$).

FIG. 7E illustrates a cross-sectional view of a SONOS non-volatile charge trap memory device, in accordance with an embodiment of the present invention. Upon fabrication of an ONO stack including tunneling layer 402, charge trapping layer 404 and blocking layer 406, a non-volatile charge trap memory device may be fabricated to include a patterned portion of the ONO stack. Charge trapping layer 404 further includes an oxygen-rich silicon oxynitride first dielectric layer 404A and a silicon-rich silicon oxynitride second dielectric layer 404B, wherein the second dielectric layer 404B has a higher nitrogen concentration at the interface of the silicon dioxide blocking layer 406 than at the interface of the oxygen-rich silicon oxynitride first dielectric layer 404A.

The SONOS device includes a patterned portion of the ONO stack formed over a substrate 400. A gate layer 408 is disposed on the blocking layer 406. The non-volatile charge trap memory device further includes source and drain regions 412 in substrate 400 on either side of the ONO stack, defining a channel region 414 in substrate 400 underneath the ONO stack. A pair of dielectric spacers 410 isolates the sidewalls of tunneling layer 402, charge trapping layer 404, blocking layer 406 and gate layer 408.

Gate layer 408 may be composed of any conductor or semiconductor material suitable for accommodating a bias during operation of a SONOS-type transistor. In accordance with an embodiment of the present invention, gate layer 408 is formed by a chemical vapor deposition process and is composed of doped poly-crystalline silicon. In another embodiment, gate layer 408 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Source and drain regions 412 may be any regions having opposite conductivity to channel region 414. For example, in accordance with an embodiment of the present invention, source and drain regions 412 are N-type doped regions while channel region 414 is a P-type doped region. In one embodiment, substrate 400 and, hence, channel region 414, is composed of boron-doped single-crystal silicon having a boron concentration in the range of $1\times10^{15}$-$1\times10^{19}$ atoms/cm$^3$. Source and drain regions 412 are composed of phosphorous- or arsenic-doped regions having a concentration of N-type dopants in the range of $5\times10^{16}$-$5\times10^{19}$ atoms/cm$^3$. In a specific embodiment, source and drain regions 412 have a depth in substrate 400 in the range of 80-200 nanometers. In accordance with an alternative embodiment of the present invention, source and drain regions 412 are P-type doped regions while channel region 414 is an N-type doped region.

Thus, plasma oxidation of a charge trapping layer to form a blocking layer in a non-volatile charge trap memory device has been disclosed. Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of fabricating a non-volatile charge trap memory device, comprising:
   forming a first dielectric layer on a substrate to form a tunneling layer of the non-volatile charge trap memory device;
   forming, on the tunneling layer, a second dielectric layer as a charge trapping layer of the non-volatile charge trap memory device; and
   oxidizing a portion of the charge trapping layer with a low temperature process to form a blocking layer of the non-volatile charge trap memory device, wherein the low temperature oxidation process further comprises:
   holding the substrate on a susceptor, the susceptor heated to temperature of between of between 300° C. and 400° C.;
   exposing the charge trapping layer to a plasma;
   introducing a gas mixture including hydrogen $H_2$ and oxygen $(O_2)$, wherein the $H_2$ volume percent is approximately zero percent (0%) to ninety percent (90%); and
   energizing the gas mixture under chamber pressure between approximately 1 mT and approximately 50 mT with an RF power source to form the plasma.

2. The method of claim 1, wherein the gas mixture further comprises helium (He).

3. The method of claim 1, wherein the plasma is energized with a high density plasma (HDP) source delivering between about 1500 W and 10000 W power normalized to a 300 mm substrate.

4. The method of claim 3, wherein the plasma is further energized with a bias power below approximately 1000 W, normalized to a 300 mm substrate, to provide a low bias voltage on the substrate.

5. The method of claim 1, wherein the non-volatile charge trap memory device fabricated is a SONOS device and the substrate is single crystalline silicon.

6. A method of fabricating a non-volatile charge trap memory device, comprising:
   forming, on a semiconductor substrate, a tunneling layer of the non-volatile charge trap memory device;
   forming, on the tunneling layer, a charge trapping layer of the non-volatile charge trap memory device, wherein forming the charge trapping layer further comprises:
   exposing the charge trapping layer to a plasma oxidation process comprising:
   holding the semiconductor substrate on a susceptor, the susceptor heated to a temperature of between 300° C. and 400° C.;
   introducing a gas mixture at a chamber pressure between approximately 1 mT and approximately 5 mT, the gas mixture including hydrogen $(H_2)$ and oxygen $(O_2)$ at a $H_2$ volume percent is approximately zero percent (0%) to ninety percent 90%; and
   energizing the gas mixture with an RF power source to form the plasma;
   depositing an oxygen-rich silicon oxynitride layer on the tunneling layer, and
   depositing a silicon-rich silicon oxynitride layer on the oxygen-rich silicon oxynitride layer, the silicon-rich silicon oxynitride layer having a higher wt % of silicon than the oxygen-rich silicon oxynitride layer;
   and oxidizing a portion of the silicon-rich silicon oxynitride layer with a plasma process to form a blocking layer of the non-volatile charge trap memory device.

7. The method of claim 6, wherein the oxygen-rich silicon oxynitride is formed to a thickness in the range of approximately 2.5 run to 3.5 nm and the silicon-rich silicon oxynitride layer is formed to a thickness in the range of approximately 9 nm to 10 nm; and wherein exposing the charge trapping layer to the plasma oxidation process oxidizes less than the entire thickness of the silicon-rich, silicon oxynitride layer.

8. The method of claim 7, exposing the charge trapping layer to a plasma oxidation further comprises energizing the plasma for between 20 and 60 seconds to oxidize approximately 2 nm to approximately 3 nm of a top surface of the silicon-rich silicon oxynitride layer and form the blocking layer to a thickness of approximately 3.5 nm to approximately 4.5 rim.

9. The method of claim 6, wherein the silicon-rich, silicon oxynitride layer is deposited at a temperature between approximately 700° C. to approximately 850° C. with a process gas comprising a first mixture including $N_2O$ and $NH_2$ at a volumetric flow rate ratio from about 1:8 to about 1:4 with $SiH_2Cl_2$ and $NH_2$ at a volumetric flow rate ratio from about 3.5:1 to 5:1.

10. The method of claim 6, further comprising:

annealing the blocking layer, wherein the annealing comprises heating the substrate in an atmosphere comprising a gas selected from the group consisting of: nitrogen ($N_2$), nitrous oxide ($N_2O$), nitrogen dioxide ($NO_2$), nitric oxide (NO) and ammonia ($NH_2$), at a temperature approximately in the range of 800° C.-1100° C.

11. The method of claim 6, wherein the semiconductor substrate is single crystalline silicon and the gate electrode comprises polysilicon and the non-volatile charge trap memory device fabricated is a SONOS device.

* * * * *